United States Patent

Baitz

[11] Patent Number: 6,155,842
[45] Date of Patent: Dec. 5, 2000

[54] ELECTRONIC EQUIPMENT HAVING STACKABLE HOUSINGS WITH A PRINTED CIRCUIT BOARD EXTENDING FROM ONE HOUSING INTO ANOTHER HOUSING

[75] Inventor: Guenter Baitz, Berlin, Germany

[73] Assignee: Siemens Nixdorf Informationssysteme Aktiengesellschaft, Paderborn, Germany

[21] Appl. No.: 09/214,687
[22] PCT Filed: Jul. 2, 1997
[86] PCT No.: PCT/DE97/01394
  § 371 Date: Jan. 8, 1999
  § 102(e) Date: Jan. 8, 1999
[87] PCT Pub. No.: WO98/01801
  PCT Pub. Date: Jan. 15, 1998

[30] Foreign Application Priority Data

Jul. 9, 1996 [DE] Germany ............ 196 27 651

[51] Int. Cl.⁷ ................................... H01R 9/09
[52] U.S. Cl. ............................. 439/61; 439/74
[58] Field of Search ............... 439/61, 55, 59, 439/62, 74, 376, 377, 924, 591; 361/730, 733, 784, 785, 788, 796, 797

[56] References Cited

U.S. PATENT DOCUMENTS

| | | | |
|---|---|---|---|
| 5,407,362 | 4/1995 | Carstens et al. | 439/347 |
| 5,785,533 | 7/1998 | Baitz et al. | 437/60 |
| 5,788,510 | 8/1998 | Walker | 439/61 |
| 5,903,442 | 5/1999 | Karai et al. | 439/61 |
| 5,926,378 | 7/1999 | Dewitt et al. | 439/61 |
| 5,967,796 | 10/1999 | Harfield et al. | 439/61 |
| 5,986,473 | 4/1999 | Kaspari | 439/61 |

FOREIGN PATENT DOCUMENTS

| | | |
|---|---|---|
| 0 687 983 | 12/1995 | European Pat. Off. . |
| 1 257 235 | 12/1967 | Germany . |
| 81 09 507 U | 7/1981 | Germany . |
| 81 29 746 U | 1/1982 | Germany . |
| 86 01 781 U | 5/1986 | Germany . |
| WO 95/14367 | 5/1995 | WIPO . |

OTHER PUBLICATIONS

"Enhanced Riser Card with Expansion Function Capability for Personal Computers", *IBM Technical Disclosure Bulletin*, vol. 37, No. 7, Jul. 1994, pp. 189–191.

*Primary Examiner*—Brian Sircus
*Assistant Examiner*—J. F. Duverne
*Attorney, Agent, or Firm*—Hill & Simpson

[57] ABSTRACT

An electronic equipment has a housing structure formed by a first housing, a supplemental housing attached on one wall surface of the first housing, a base printed circuit board being inserted in the first housing, a PC bus plug connector being mounted on the base printed circuit board, the first housing and the supplemental housing having openings aligned with the PC bus plug connector, and an additional printed circuit board, such as an adapter card, being inserted in the PC bus plug connector and extending through the apertures into the supplemental housing. This adapter card has additional plug connectors which are arranged to lie in both the first-mentioned housing and the supplemental housing to receive supplemental printed circuit boards provided in each of these housings.

10 Claims, 2 Drawing Sheets

ELECTRONIC EQUIPMENT HAVING STACKABLE HOUSINGS WITH A PRINTED CIRCUIT BOARD EXTENDING FROM ONE HOUSING INTO ANOTHER HOUSING

This application is a 371 of PCT/DE97/01394.

BACKGROUND OF THE INVENTION

The invention relates to a housing for PC-based electronic equipment having a base printed circuit board with a printed circuit bus plug connector for an additional printed circuit board being received in the housing with the additional printed circuit board extending perpendicular to the base printed circuit board and having at least one additional plug connection for a supplementary printed circuit board, and to electronic equipment having such a housing.

A housing of the mentioned type for PC-based control equipment is known from WO 95/14367 A1. A base printed circuit board is disposed therein parallel to the floor plate of the housing, onto which printed circuit board an AT bus adaptor card aligned perpendicular thereto is fitted. The latter is equipped with two plug connectors, into which in each case one supplementary printed circuit board can be inserted. The supplementary printed circuit boards are aligned parallel to the base printed circuit board.

The number of supplementary printed circuit boards is limited only by the number of plug connectors on the AT bus adaptor card; however, it determines the height or length of the AT bus adaptor card and thus the height of the housing. Accordingly, in each case it is necessary to provide a housing which offers space for the maximum required number of supplementary printed circuit boards. Accordingly, in many practical applications an unnecessarily large and thus costly housing is used.

SUMMARY OF THE INVENTION

The object of the invention is accordingly to specify a housing for PC-based electronic equipment, which is designed for minimal equipping with supplementary printed circuit boards but offers a simple possibility of extension with respect to the number of supplementary printed circuit boards.

A housing wall opposite the base printed circuit board having an aperture through which a portion of the additional printed circuit board or adapter card plugged into the bus plug connector of the base printed circuit board can extend through and which portion has at least one additional plug connector for the supplementary printed circuit board.

A base printed circuit board to be aligned parallel to a first housing wall can be inserted into the housing, on which base printed circuit board a PC bus plug connector for an adaptor card which can be fitted to extend normal to the printed circuit board, is disposed. An aperture is formed in the housing wall opposite the first housing wall, through which aperture, when the base printed circuit board has been inserted, an adaptor card inserted into the PC bus plug connector is able to protrude at least by a part of its surface. The aperture can be formed as a slot in the housing wall, but can also be by omission of this housing wall.

In the case of the use of an adaptor card which is designed for minimal equipping of the housing with supplementary printed circuit boards and which accordingly does not protrude from the housing, the aperture can be closed off by a cover plate. The same applies if an adaptor card is dispensed with. The cover plate is preferably releasably connected to the housing, for example by screws or a detent connection. This permits subsequent equipping of the arrangement with further or additional supplementary printed circuit boards.

In a further refinement of the invention, a supplementary housing can be fitted onto the housing wall provided with the aperture, and a housing surface of which supplementary housing the is then adjacent to the first housing is being provided with a housing opening which leaves the aperture free. The housing opening is cut out from a wall of the supplementary housing, which wall faces the first housing, and corresponds in its dimensions to the aperture in the wall of the first housing. However, it can also be formed by omission of a housing first wall of the supplementary housing, so that the supplementary housing is designed as cover hood for a space enclosed between it and the first housing. The supplementary housing is to be releasably secured to the first housing, for which purpose a screw connection or detent connection can again be used.

Further particular features and advantages of the invention as well as the use thereof in the case of electronic equipment are described in the text which follows with reference to an illustrative embodiment shown in the drawing.

DESCRIPTION OF THE PREFERRED EMBODIMENTS

Figure 1:
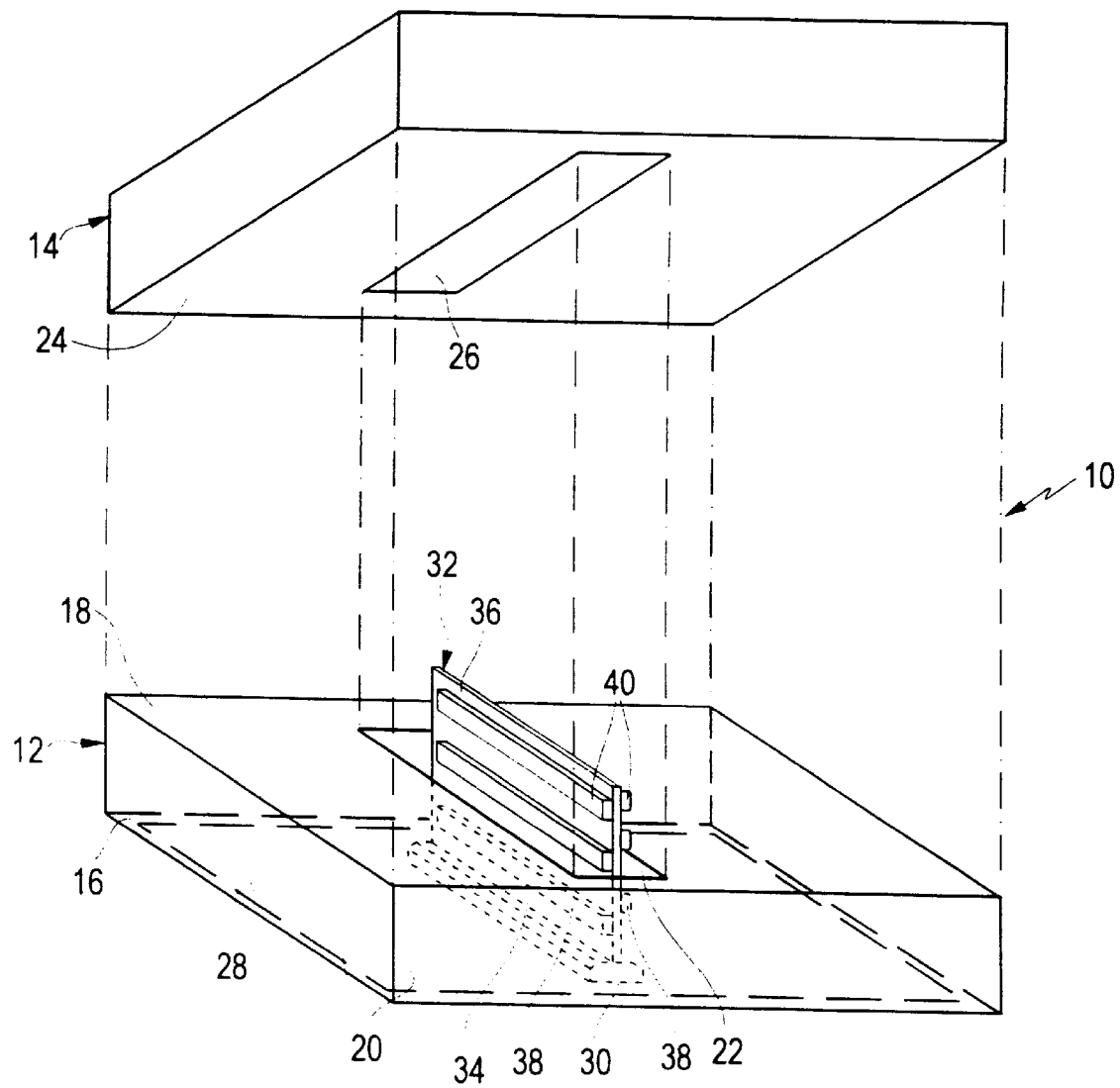
FIG. 1 is a perspective view of electronic equipment having a housing/supplementary housing combination in exploded representation.

FIG. 1 illustrates a PC-based electronic equipment 10 having a casing consisting of a parallelepipedic housing 12 and a supplementary housing 14, in a exploded representation. The housing has six housing walls: a floor 16, a cover plate 18 as well as side walls 20, only two of which can be seen in FIG. 1. An aperture 22 has been cut out from the cover plate 18.

The supplementary housing 14 is likewise parallelepipedic and has a floor surface or plate 24 corresponding to the cover plate 18. In the floor plate 24 of the supplementary housing 14 there is formed a housing opening 26 which—as can be seen by reference to the chain-dotted outlines—is in alignment with the aperture 22. The aperture 22 and the housing opening 26 can also be shaped differently, and the floor plate 24 can also be entirely absent. What is essential is merely that, when the supplementary housing 14 has been fitted onto the housing 12, the resultant clear width of a passage bounded by the margins of the aperture 22 or of the housing opening 26 permits the passage of an adaptor card 32 which is described hereinbelow.

A base printed circuit board 28 is built into the housing 12, parallel to the floor 16. This base printed circuit board is equipped with a PC bus plug connector 30, which is disposed on the base printed circuit board 28 in such a way that an adaptor card 32 inserted into it is able to protrude through the aperture 26. A first partial surface 34 of the adaptor card 32 lies within the housing 12, while a second partial surface or portion 36 of the adaptor card 32 protrudes out of the aperture 22 and, when the supplementary housing 14 has been fitted onto the housing 12, portion 36 protrudes into said supplementary housing. The partial surfaces 34, 36 of the adaptor card 32 are equipped on both sides with second plug connectors 38 and third plug connectors 40 respectively.

Figure 2:
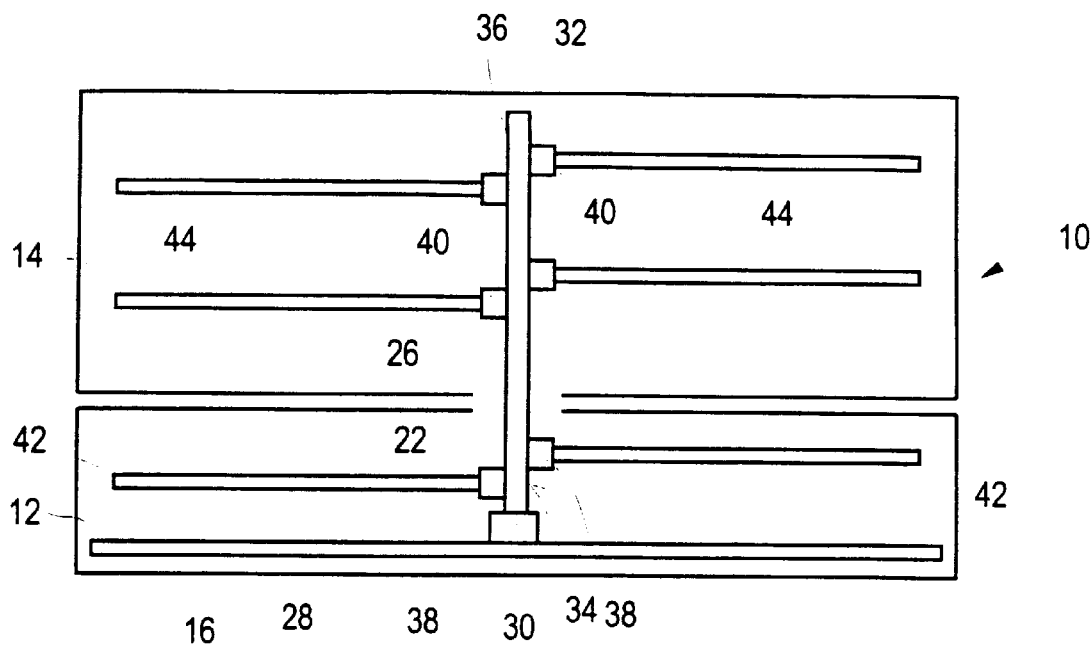
FIG. 2 is a diagrammatic side elevational view of the electronic equipment in a maximal configuration.

In FIG. 2, the above-described arrangement is diagrammatically represented in a sectioned side elevation, with maximal equipping with supplementary printed circuit boards 42, 44. Supplementary printed circuit boards 42 are inserted into the second plug connectors 38 situated in the housing 12 and supplementary printed circuit boards 44 are inserted into the third plug connectors 40 embraced by the supplementary housing 14, in such a way that they are aligned parallel to the base printed circuit board 28.

Figure 3:
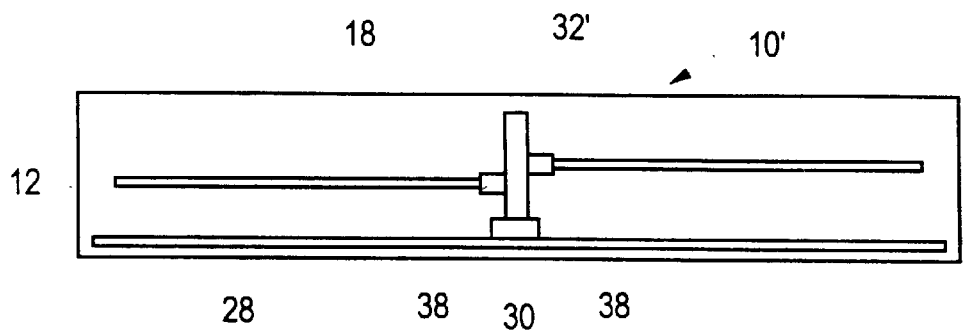
FIG. 3 is a diagrammatic side elevational view of the electronic equipment in a minimal configuration.

In FIG. 3, electronic equipment 10' with supplementary printed circuit boards 42 is diagrammatically represented in a sectioned side elevation. An adaptor card 32' has been inserted into the PC bus plug connector 30, the height of the adaptor card 32' does not exceed the space available above the base printed circuit board 28 in the housing 12. Two supplementary printed circuit boards 42 have been inserted into the second plug connectors 38 situated on the adaptor card 32'.

Figure 4:
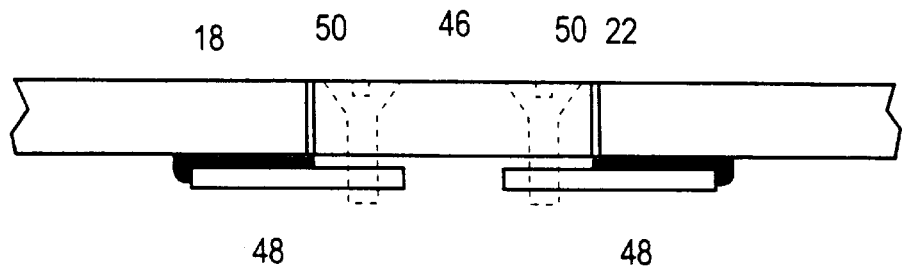
FIG. 4 is an enlarged cross-sectional view of a housing wall provided with an aperture.

FIG. 4 shows, in an enlarged section, that region of the cover plate 18 in FIG. 3 which is situated above the adaptor card 32'. The aperture 22 is closed off by a cover plate 46 at the same level as the cover plate 18. The cover plate 46 abuts against abutments 48 which, in the interior of the housing 12, are connected to the cover plate 18, for example by welding or adhesive bonding. The cover plate 46 is releasably secured on the abutments 48 by means of screws 50.

The electronic equipment 10 may comprise, for example, the electronics box of a PC-based cash register or of an office computer. In this case, the computer unit is accommodated on a base printed circuit board 28. In the case of such equipment, it is frequently sufficient to provide one or two supplementary printed circuit boards, which may, for example, carry supplementary circuits which are specific to a point of sale or a network. In this case, equipping in accordance with FIG. 3 is sufficient. If, however, such equipment is to be responsible for further functions, then, in a simple manner, the cover plate 46 may be removed and the short adaptor card 32' may be replaced by a higher or longer adaptor card 32, which, besides the second plug connectors 38, is equipped with third plug connectors 40. The supplementary housing 14 is fitted onto the housing 12. The supplementary printed circuit boards 42 can, as previously, be disposed in the housing 12, while further supplementary printed circuit boards 44 can be inserted into the third plug connectors 40 of the second partial surface 36 of the adaptor card 32, which partial surface protrudes into the supplementary housing 14.

Since all assemblies required for the operation of a PC are to be accommodated in the housing 12, the supplementary housing 14 has merely the function of a cover. Accordingly, it can be constructed in very simple fashion. On the other hand, however, it is also possible to accommodate peripheral systems such as, for example, supplementary magnetic disk drives, a window scanner for bar code detection or an emergency power supply, in the supplementary housing 14.

I claim:

1. An electronic equipment having a first housing, a base printed circuit board being inserted in said first housing, a PC bus plug connector being mounted on said base printed circuit board, a further printed circuit board being mounted in said PC bus plug connector to extend perpendicular from the base printed circuit board, said further printed circuit board having at least one additional plug connector, and a supplemental printed circuit board being inserted in said supplemental connector, a first housing wall of said first housing having an aperture aligned with the PC bus plug connector, a supplemental housing being mounted on the first housing wall, a portion of the further printed circuit board inserted into the PC plug connector extending out of the aperture of said first housing wall and into the supplemental housing and said portion having at least one of the additional plug connectors.

2. An electronic equipment according to claim 1, wherein the further printed circuit board is an adapter card.

3. A housing structure for a PC bus electronic equipment comprising a first housing having a first housing wall, a second housing wall and a base printed circuit board, a further printed circuit board, a PC bus plug connector being mounted on the base printed circuit board for receiving the further printed circuit board, which extend vertically to the base printed circuit board, said further printed circuit board having at least one additional plug connector, and at least a supplemental printed circuit board being inserted in said additional plug connector, said housing having an aperture in the second housing wall overlying the PC bus plug connector, a supplemental housing fitted on the second housing wall and having an opening aligned with the aperture, said further printed circuit board having a length greater than the height of the first housing and having a part protruding into the supplemental housing, said part carrying at least one additional plug connector which is arranged in the supplemental housing.

4. A housing structure according to claim 3, in which the aperture can be closed off by a cover plate.

5. A housing structure according to claim 4, wherein the cover plate is releasably connected to the housing.

6. A housing structure according to claim 3, in which the supplemental housing is to be releasably secured to the first-mentioned housing.

7. A housing structure according to claim 3, wherein the base printed circuit board is mounted to extend parallel to the first housing wall.

8. A housing structure according to claim 7, in which the aperture can be closed off by a cover plate.

9. A housing structure according to claim 8, in which the cover plate is releasably connected to the housing.

10. A housing structure according to claim 7, wherein the supplemental housing is to be releasably secured to the first-mentioned housing.

* * * * *